(12) United States Patent
Sakai et al.

(10) Patent No.: US 10,148,064 B2
(45) Date of Patent: Dec. 4, 2018

(54) SEMICONDUCTOR LASER DRIVING APPARATUS, OPTICAL SCANNING APPARATUS, OBJECT DETECTION APPARATUS, AND MOBILE APPARATUS

(71) Applicants: Kohji Sakai, Tokyo (JP); Masataka Uehira, Kanagawa (JP); Shigeaki Imai, Kanagawa (JP); Tadashi Nakamura, Kanagawa (JP)

(72) Inventors: Kohji Sakai, Tokyo (JP); Masataka Uehira, Kanagawa (JP); Shigeaki Imai, Kanagawa (JP); Tadashi Nakamura, Kanagawa (JP)

(73) Assignee: RICOH COMPANY, LTD, Tokyo (JP)

( * ) Notice: Subject to any disclaimer, the term of this patent is extended or adjusted under 35 U.S.C. 154(b) by 297 days.

(21) Appl. No.: 15/058,730

(22) Filed: Mar. 2, 2016

(65) Prior Publication Data
US 2016/0261090 A1    Sep. 8, 2016

(30) Foreign Application Priority Data

Mar. 5, 2015    (JP) .................................. 2015-043346

(51) Int. Cl.
*H01S 5/042*    (2006.01)
*G01S 17/10*    (2006.01)
(Continued)

(52) U.S. Cl.
CPC .............. *H01S 5/042* (2013.01); *G01S 7/484* (2013.01); *G01S 7/4972* (2013.01); *G01S 17/02* (2013.01);
(Continued)

(58) Field of Classification Search
CPC ........ H01S 5/042; H01S 5/0428; G01S 17/02; G01S 7/4972; G01S 7/484; G01S 17/42;
(Continued)

(56) References Cited

U.S. PATENT DOCUMENTS 5,790,244 A    8/1998    Dunne
5,889,583 A    3/1999    Dunne
(Continued)

FOREIGN PATENT DOCUMENTS

EP    1 160 585 A2    12/2001
EP    1 211 762 A1    6/2002
(Continued)

OTHER PUBLICATIONS

U.S. Appl. No. 14/837,552, filed Aug. 27, 2015.
(Continued)

*Primary Examiner* — Tony Ko
(74) *Attorney, Agent, or Firm* — Oblon, McClelland, Maier & Neustadt, L.L.P.

(57) ABSTRACT

A semiconductor laser driving apparatus for driving a semiconductor laser serving as a light source for optical scanning, the semiconductor laser driving apparatus includes: first and second switching elements that are each capable of switching energization of the semiconductor laser ON/OFF; a first pulse generation unit that intermittently outputs first driving pulses to the first switching element in a first time slot; and a second pulse generation unit that outputs a second driving pulse to the second switching element in a second time slot different from the first time slot.

20 Claims, 10 Drawing Sheets

(51) Int. Cl.
    *G01S 17/42*     (2006.01)
    *G01S 7/484*     (2006.01)
    *G01S 7/497*     (2006.01)
    *G02B 26/12*     (2006.01)
    *G01S 17/02*     (2006.01)
    *G01S 17/93*     (2006.01)
    *G01S 7/481*     (2006.01)

(52) U.S. Cl.
    CPC .............. *G01S 17/10* (2013.01); *G01S 17/42* (2013.01); *G02B 26/127* (2013.01); *H01S 5/0428* (2013.01); *G01S 7/4817* (2013.01); *G01S 17/936* (2013.01)

(58) Field of Classification Search
    CPC ...... G01S 17/10; G01S 7/4817; G01S 17/936; G02B 26/127
    See application file for complete search history.

(56) References Cited

U.S. PATENT DOCUMENTS

| | | | |
|---|---|---|---|
| 6,043,868 | A | 3/2000 | Dunne |
| 2002/0018198 | A1 | 2/2002 | Pierenkemper |
| 2002/0075919 | A1 | 6/2002 | Tochio |
| 2008/0151218 | A1 | 6/2008 | Mack et al. |
| 2010/0283413 | A1* | 11/2010 | Richter ................ G02B 26/101 315/360 |
| 2014/0009747 | A1 | 1/2014 | Suzuki et al. |
| 2014/0034817 | A1 | 2/2014 | Nakamura et al. |
| 2014/0036071 | A1 | 2/2014 | Nakamura et al. |
| 2014/0185643 | A1 | 7/2014 | McComb et al. |
| 2014/0209793 | A1 | 7/2014 | Nakamura et al. |
| 2015/0124238 | A1 | 5/2015 | Sakai et al. |
| 2015/0160341 | A1 | 6/2015 | Akatsu et al. |
| 2015/0204977 | A1 | 7/2015 | Sakai |
| 2015/0268332 | A1 | 9/2015 | Nakamura |
| 2015/0268343 | A1 | 9/2015 | Uehira et al. |
| 2015/0316650 | A1 | 11/2015 | Imai |
| 2015/0331108 | A1 | 11/2015 | Itami et al. |
| 2016/0061955 | A1 | 3/2016 | Imai et al. |
| 2016/0096474 | A1 | 4/2016 | Sakai |
| 2016/0097843 | A1 | 4/2016 | Nakamura |
| 2016/0261090 | A1 | 9/2016 | Sakai et al. |
| 2016/0274223 | A1 | 9/2016 | Imai |

FOREIGN PATENT DOCUMENTS

| | | |
|---|---|---|
| EP | 1 936 400 A1 | 6/2008 |
| JP | 2006-215483 | 8/2006 |
| JP | 2009-063339 | 3/2009 |
| JP | 2009-069003 | 4/2009 |
| JP | 2011-085577 | 4/2011 |
| JP | 2011-128112 | 6/2011 |
| JP | 2012-107984 | 6/2012 |
| JP | 2014-235075 | 12/2014 |
| JP | 2016-014577 | 1/2016 |
| JP | 2016-048211 | 4/2016 |
| JP | 2016-075495 | 5/2016 |
| JP | 2016-075564 | 5/2016 |
| JP | 2016-161533 A | 9/2016 |
| JP | 2016-176721 A | 10/2016 |
| JP | 2017-3785 A | 1/2017 |
| JP | 2017-32552 A | 2/2017 |

OTHER PUBLICATIONS

U.S. Appl. No. 14/813,321, filed Jul. 30, 2015.
U.S. Appl. No. 14/872,534, filed Oct. 1, 2015.
Extended European Search Report dated Aug. 3, 2016 in Patent Application No. 16158287.9.

\* cited by examiner

SEMICONDUCTOR LASER DRIVING APPARATUS, OPTICAL SCANNING APPARATUS, OBJECT DETECTION APPARATUS, AND MOBILE APPARATUS

CROSS-REFERENCE TO RELATED APPLICATIONS

The present application claims priority to and incorporates by reference the entire contents of Japanese Patent Application No. 2015-043346 filed in Japan on Mar. 5, 2015.

BACKGROUND OF THE INVENTION

1. Field of the Invention

The present invention relates to a semiconductor laser driving apparatus, an optical scanning apparatus, an object detection apparatus, and a mobile apparatus. In particular, the present invention relates to a semiconductor laser driving apparatus that drives a semiconductor laser, an optical scanning apparatus that includes the semiconductor laser driving apparatus, an object detection apparatus that includes the optical scanning apparatus, and a mobile apparatus that includes the object detection apparatus.

2. Description of the Related Art

Apparatuses for detecting the presence or absence of an object, a distance to the object, and the like have been actively developed in recent years (for example, see Japanese Laid-open Patent Publication No. 2011-128112, Japanese Laid-open Patent Publication No. 2009-063339, Japanese Laid-open Patent Publication No. 2012-107984 and Japanese Laid-open Patent Publication No. 2009-069003).

Japanese Laid-open Patent Publication No. 2011-085577 discloses a laser radar apparatus which includes a rotary encoder for accurately detecting a scanning position of light beam.

With the conventional apparatuses, it has been difficult to accurately detect the scanning position while suppressing an increase in cost.

SUMMARY OF THE INVENTION

It is an object of the present invention to at least partially solve the problems in the conventional technology.

Exemplary embodiments of the present invention, there is provided a semiconductor laser driving apparatus for driving a semiconductor laser serving as a light source for optical scanning, the semiconductor laser driving apparatus comprising: first and second switching elements that are each capable of switching energization of the semiconductor laser ON/OFF; a first pulse generation unit that intermittently outputs first driving pulses to the first switching element in a first time slot; and a second pulse generation unit that outputs a second driving pulse to the second switching element in a second time slot different from the first time slot.

Exemplary embodiments of the present invention also provide an optical scanning apparatus comprising: a semiconductor laser; the above-described semiconductor laser driving apparatus, that drives the semiconductor laser; and a deflector that deflects light from the semiconductor laser, wherein the photodetector is arranged on an optical path of the light deflected by the deflector.

Exemplary embodiments of the present invention also provide an object detection apparatus comprising: the above-described optical scanning apparatus; and a light detection system that detects light that is emitted from the optical scanning apparatus and reflected by an object.

Exemplary embodiments of the present invention also provide a mobile apparatus comprising: the above-described object detection apparatus; and a moving body on which the object detection apparatus is mounted.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
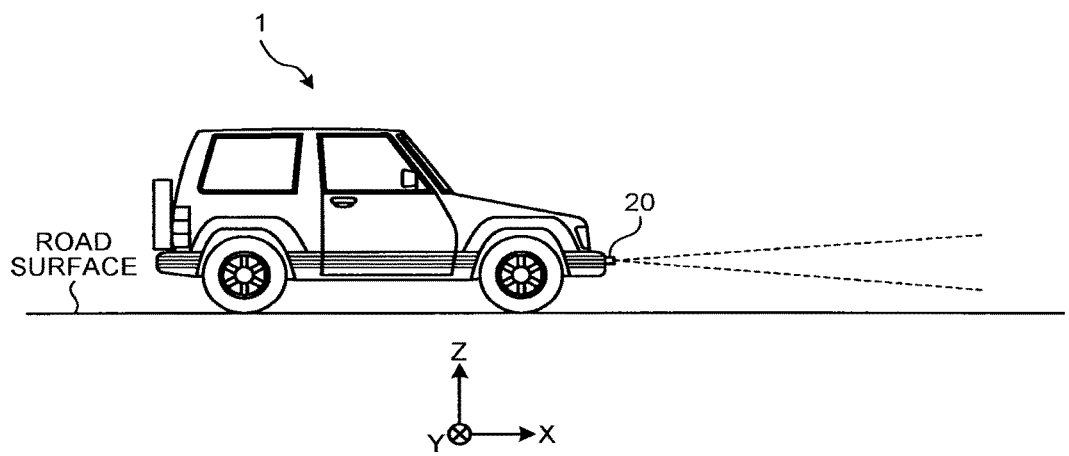
FIG. 1 is a diagram illustrating an appearance of an automobile on which a laser radar according to an embodiment of the present invention is mounted.

An embodiment of the present invention will be described below with reference to FIGS. 1 to 10. FIG. 1 illustrates an appearance of an automobile 1 on which a laser radar 20 serving as an object detection apparatus according to the embodiment is mounted.

For example, the laser radar 20 is attached to near a license plate on the front of the automobile 1 which serves as a mobile apparatus. In other words, the automobile 1 includes a vehicle main body serving as a moving body and the laser radar 20 mounted on the vehicle main body. In the present specification, a direction orthogonal to a road surface in an XYZ three-dimensional orthogonal coordinate system will be referred to as a Z-axis direction, and the forward direction of the automobile 1 as a +X direction.

Figure 2:
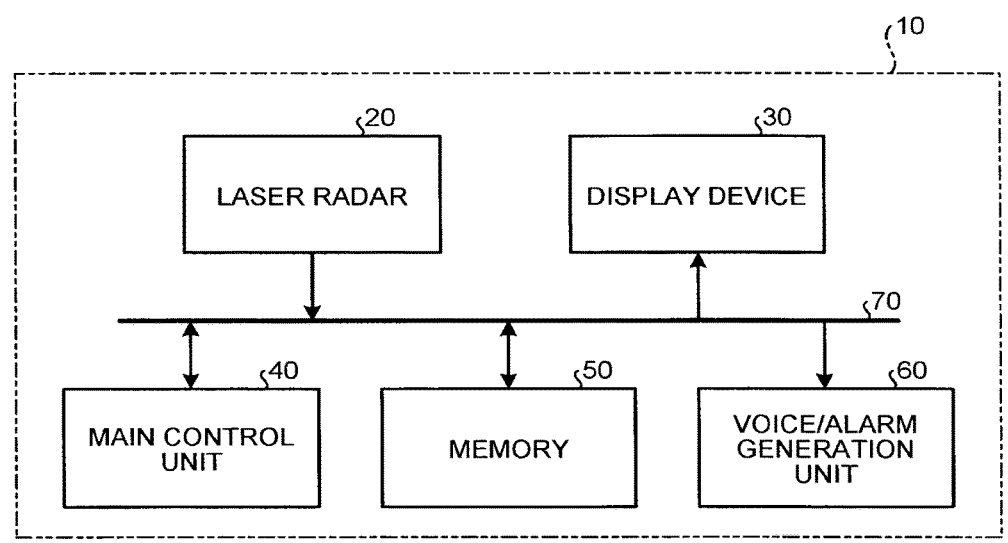
FIG. 2 is a diagram for describing a connection relationship between the laser radar, a display unit, a main control unit, a memory, and a voice/alarm generation unit.

For example, as illustrated in FIG. 2, a display unit 30, a main control unit 40, a memory 50, a voice/alarm generation unit 60, and the like are arranged in the automobile 1. Such devices are electrically connected via a bus 70 which is capable of data transmission.

The laser radar 20, the display unit 30, the main control unit 40, the memory 50, and the voice/alarm generation unit 60 constitute a monitoring apparatus 10 serving as a sensing apparatus. In other words, the monitoring apparatus 10 is mounted on the automobile 1.

The main control unit 40 controls the laser radar 20 at predetermining regular timing on the basis of object information and the like stored in the memory 50 to detect the presence or absence of an object in front of the automobile 1. If there is an object, the main control unit 40 determines the presence or absence of movement of the object. If the object is moving, the main control unit 40 determines movement information including the moving direction and moving speed of the object. The main control unit 40 displays the object information and the movement information on the display unit 30.

If the main control unit 40 determines on the basis of the object information and the movement information that there is a danger, the main control unit 40 outputs alarm information to the voice/alarm generation unit 60.

Figure 3:
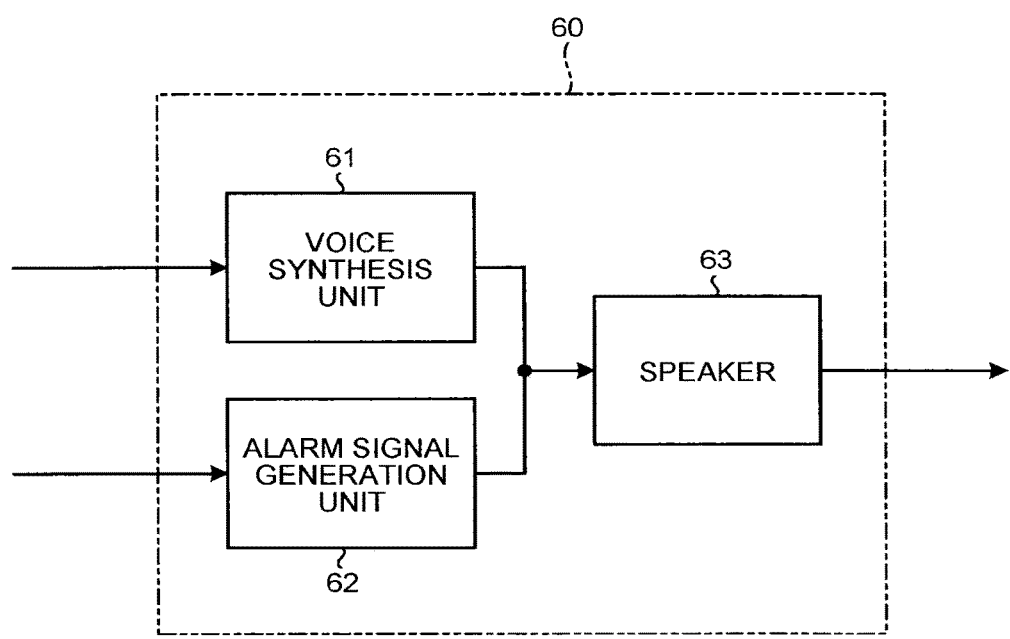
FIG. 3 is a diagram for describing a configuration of the voice/alarm generation unit.

For example, as illustrated in FIG. 3, the voice/alarm generation unit 60 includes a voice synthesis unit 61, an alarm signal generation unit 62, and a speaker 63.

The voice synthesis unit 61 contains a plurality of pieces of voice data. If the voice synthesis unit 61 receives the alarm information from the main control unit 40, the voice synthesis unit 61 selects and outputs a corresponding piece of voice data to the speaker 63. If the alarm signal generation unit 62 receives the alarm information from the main control unit 40, the alarm signal generation unit 62 generates and outputs a corresponding alarm signal to the speaker 63.

The laser radar 20 will be described in detail below.

Figure 4:
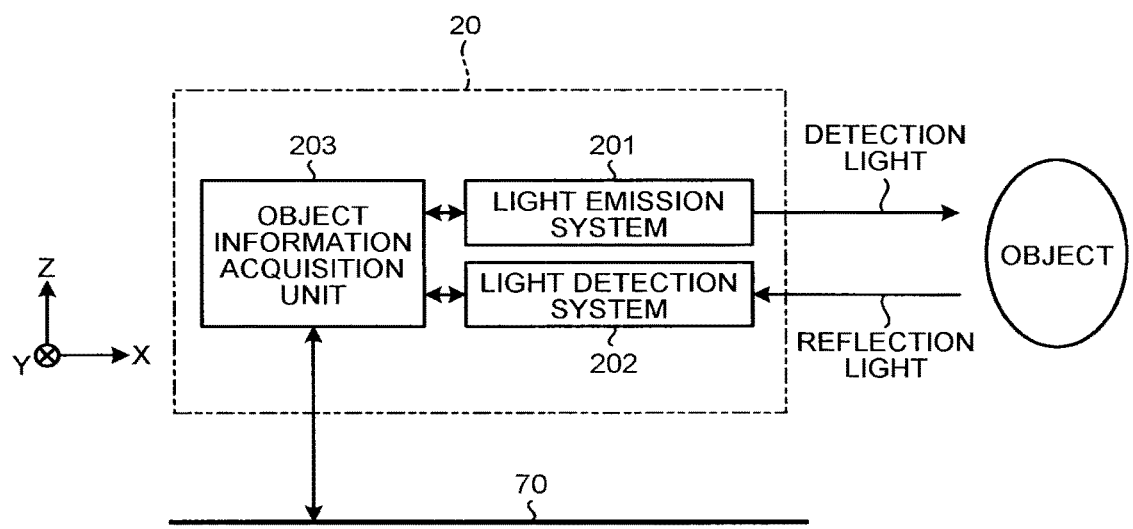
FIG. 4 is a diagram for describing the laser radar.

For example, as illustrated in FIG. 4, the laser radar 20 includes a light emission system 201, a light detection system 202, and an object information acquisition unit 203. The light emission system 201 emits detection light in the +X direction. The light detection system 202 detects light reflected by an object. The object information acquisition unit 203 controls the light emission system 201, and obtains object information on the basis of a result of detection of the light detection system 202. The object information includes the presence or absence of an object, the distance to the object, the size of the object, the shape of the object, and the position of the object. The light emission system 201 is arranged on a +Z side of the light detection system 202. The light emission system 201, the light detection system 202, and the object information acquisition unit 203 are accommodated in a not-illustrated casing.

Figure 5:
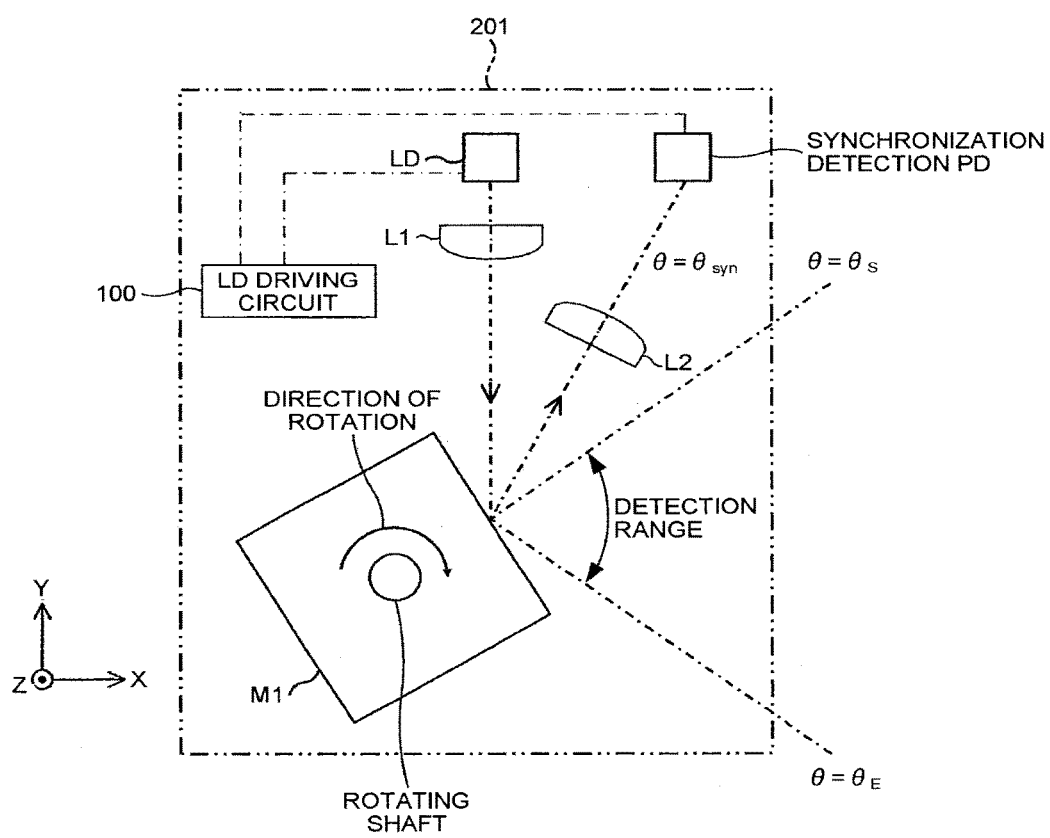
FIG. 5 is a diagram for describing a light emission system shown in FIG. 4.

As illustrated in FIG. 5, the light emission system 201 includes, for example, a laser diode (LD) serving as a light source, an LD driving circuit 100 that drives the LD, a coupling lens L1, a four-surface polygon mirror M1 (rotating mirror), an imaging forming lens L2, and a synchronization detection photodiode (PD). The coupling lens L1 is arranged on the optical path of light from the LD. The polygon mirror M1 serves as a deflector arranged on the optical path of the light passed through the coupling lens L1. The imaging forming lens L2 is arranged on an optical path of the light deflected by the polygon mirror M1 (in a position of $\theta=\theta_{syn}$ in FIG. 5). The synchronization detection PD is arranged on the optical path of the light passed through the imaging forming lens L2.

Figure 6:
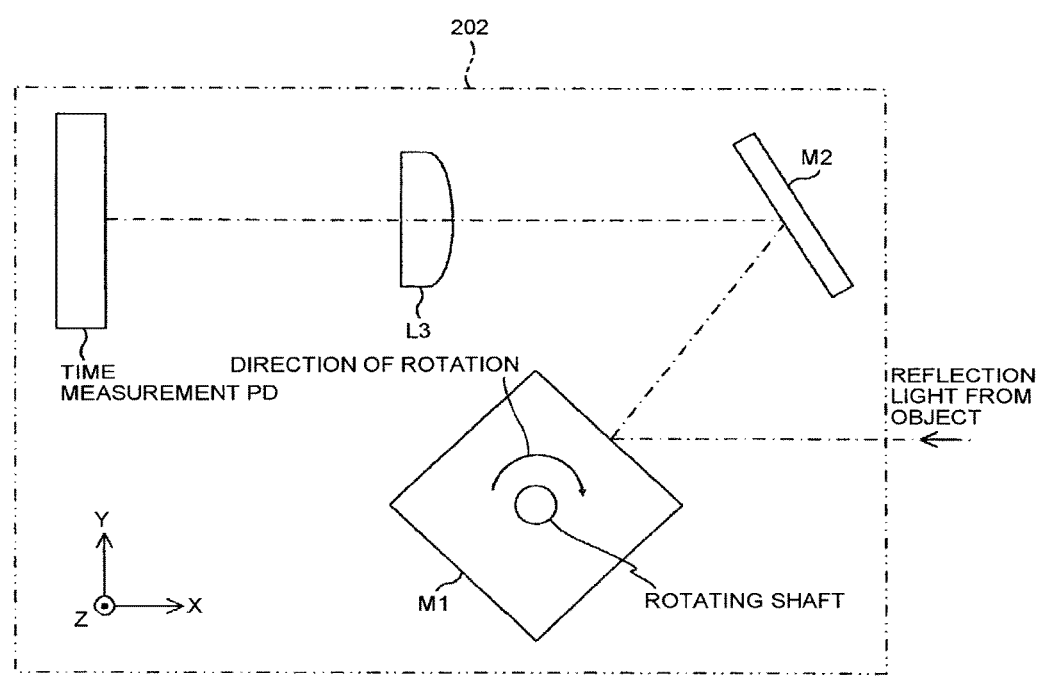
FIG. 6 is a diagram for describing a light detection system.

As illustrated in FIG. 6, the light detection system 202 includes, for example, the polygon mirror M1, a reflection mirror M2, an imaging forming lens L3, and a time measurement photodiode (PD).

As illustrated in FIG. 5, a detection range is defined to be $\theta_s \leq \theta \leq \theta_E$. If there is an object in the detection range, part of a light beam that is emitted from the laser radar 20 to the detection range and reflected by the object returns to the laser radar 20. For the sake of convenience, light that is reflected from an object and returns to the laser radar 20 may hereinafter be referred to as "reflection light from the object."

The light emission system 201 and the light detection system 202 share the polygon mirror M1. To be more specific, the light that is emitted from the LD and passed through the coupling lens L1 is reflected toward the detection range by one of deflection reflecting surfaces of the polygon mirror M1 rotating about the Z-axis (see FIG. 5). Part of the light reflected by an object lying in the detection range is reflected by the one deflection reflecting surface toward the reflection mirror M2. The light reflected by the reflection mirror M2 is condensed onto the time measurement PD by the imaging forming lens L3 (see FIG. 6).

In such a manner, the detection range is scanned by the light emitted from the light emission system 201. In other words, the light emission system 201 constitutes an "optical scanning apparatus."

The time measurement PD receives the light passed through the imaging forming lens L3, and outputs a signal according to the amount of received light to the object information acquisition unit 203. If an output level of the time measurement PD is higher than or equal to a previously-set threshold, the object information acquisition unit 203 determines that reflection light from an object is received.

For example, an avalanche photodiode (APD), a single photon avalanche diode (SPAD) which is a Geiger mode APD, and the like may be used as the photodetectors used for synchronous detection and time measurement, instead of the PDs. APDs and SPADs have higher sensitivity than that of PDs and are advantageous in terms of detection accuracy and detection distance.

The object information acquisition unit 203 controls the LD driving circuit 100, and performs driving control on the polygon mirror M1. The object information acquisition unit 203 obtains the presence or absence of an object on the basis of the output signal of the time measurement PD. If there is an object, the object information acquisition unit 203 obtains the distance to the object and the like on the basis of lighting timing of the LD and light reception timing of the time measurement PD.

The LD driving circuit 100 drives the LD on the basis of an output signal of the synchronization detection PD.

Figure 7:
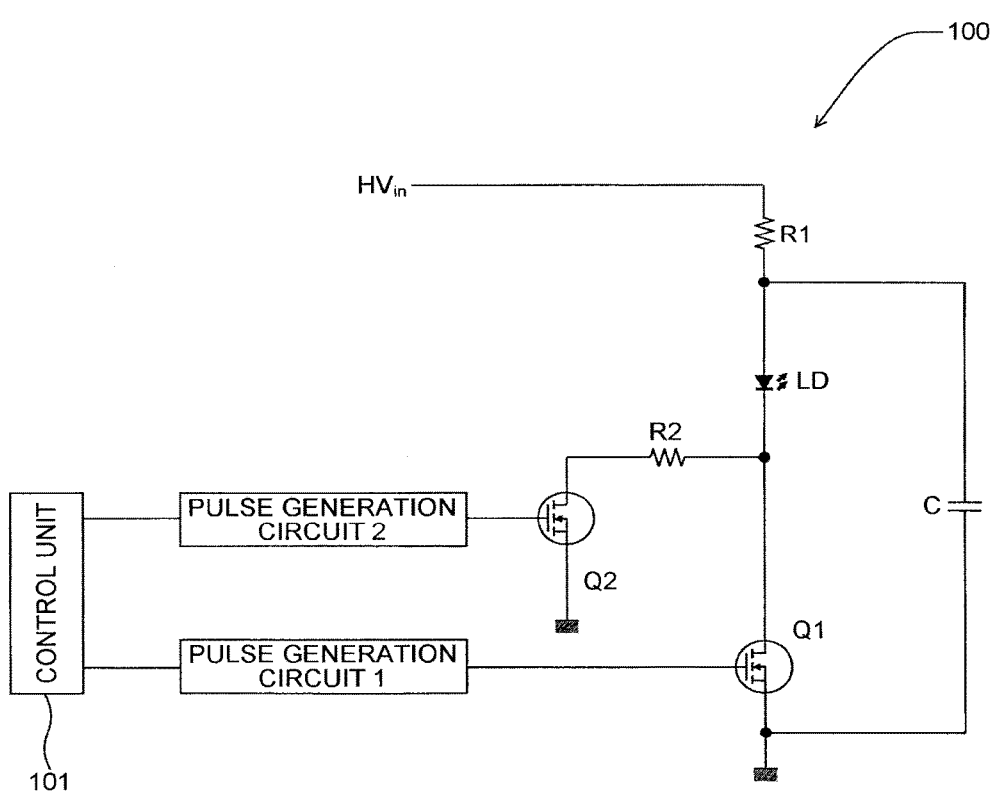
FIG. 7 is a diagram for describing an LD driving circuit included in the laser radar.

FIG. 7 schematically illustrates a configuration of the LD driving circuit 100. As illustrated in FIG. 7, a switching circuit 1 including a capacitor C and a transistor Q1, and a switching circuit 2 including a resistor R1, a resistor R2, and a transistor Q2 are connected to the LD. In other words, two switching circuits that can individually supply a driving current are connected to the LD. Here, the transistors Q1 and Q2 are each a MOSFET.

The transistor Q1 functions as a switch of the switching circuit 1. A driving pulse (voltage signal) from a pulse generation circuit 1 is input to the gate electrode of the transistor Q1.

The transistor Q2 functions as a switch of the switching circuit 2. A driving pulse (voltage signal) from a pulse generation circuit 2 is input to the gate electrode of the transistor Q2.

The pulse generation circuits 1 and 2 individually generate driving pulses at different periods T1 and T2, which are set to satisfy a relationship of T1<T2. Depending on the use purpose, usage, use environment, and the like of the laser radar 20, the periods T1 and T2 may be set so that T1>T2. The periods T1 and T2 may be set so that T1=T2.

The driving pulses generated by the pulse generation circuit 1 have a fixed pulse width. The driving pulses generated by the pulse generation circuit 2 have a variable pulse width.

Figure 8:
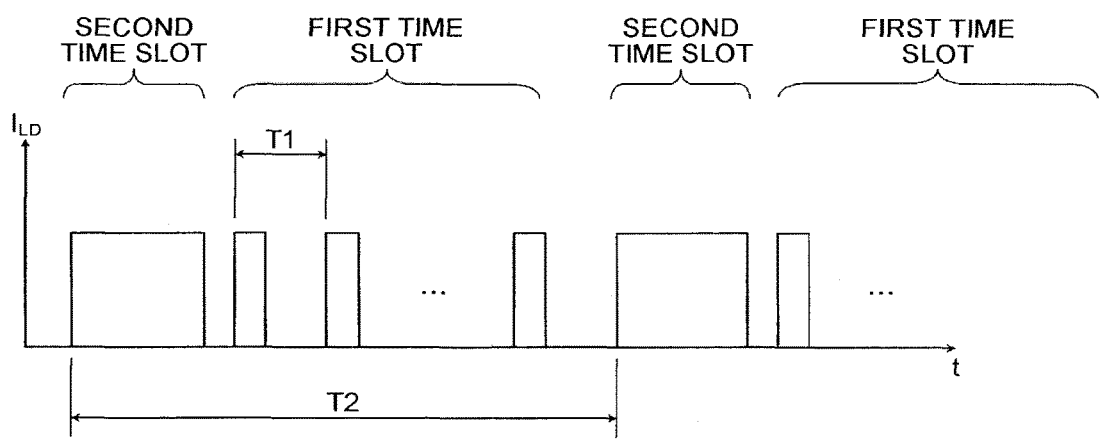
FIG. 8 is a diagram illustrating timing of supply of driving currents from two switching circuits to the LD.
Figure 9:
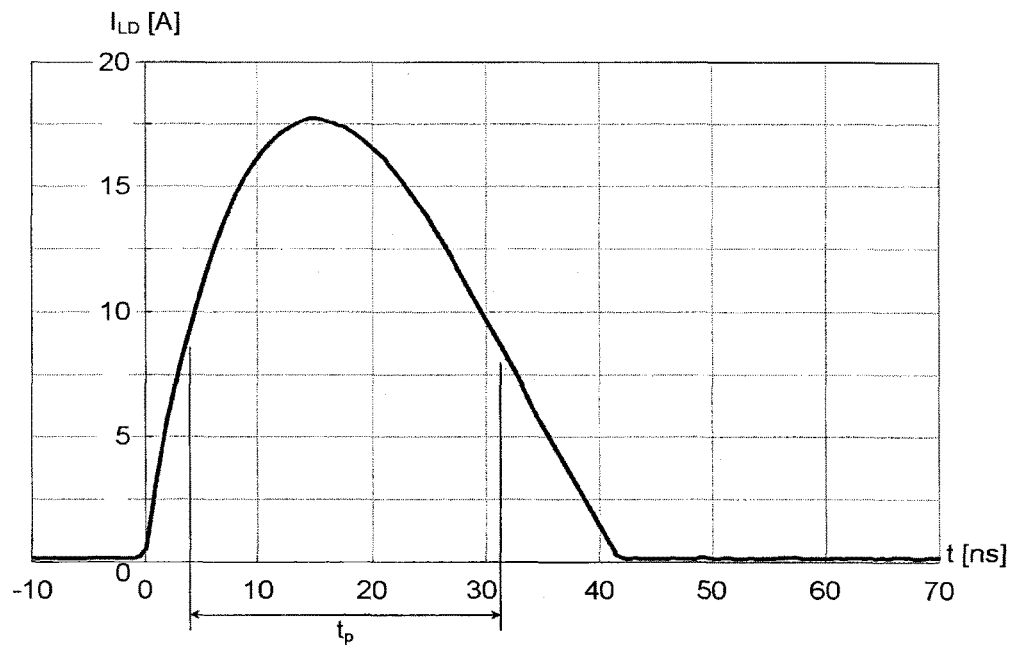
FIG. 9 is a chart illustrating a waveform of a driving current generated by one of the two switching circuits.

The two pulse generation circuits 1 and 2 are controlled by a control unit 101 to output driving pulses in different time slots (first and second time slots). Specifically, FIG. 8 illustrates the relationship in terms of a current waveform model to be applied to the LD. A driving pulse generated by the pulse generation circuit 2 is input to the transistor Q2, and then a plurality of driving pulses generated by the pulse generation circuit 1 are periodically input to the transistor Q1 (at periods T1). If the number of the plurality of driving pulses reaches a predetermined number, a driving pulse generated by the pulse generation circuit 2 is input to the transistor Q2 again. A plurality of driving pulses generated by the pulse generation circuit 1 are then periodically input to the transistor Q1 (at periods T1). The same operations are subsequently repeated. The driving pulses from the pulse generation circuit 2 to the transistor Q2 are also periodically output (at periods T2). Note that the output of the driving pulses from the pulse generation circuit 1 to the transistor Q1 does not necessarily need to be periodic, and may simply be intermittent. The output of the driving pulses from the pulse generation circuit 2 to the transistor Q2 does not necessarily need to be periodic, either, and may simply be intermittent.

The first and second time slots are alternately repeated, starting with the second time slot (see FIG. 8).

The capacitor C is a charge supply source of the switching circuit 1. If a driving pulse is input to the transistor Q1, the capacitor C is triggered to supply all its charge to the LD in an extremely short time and the LD emits light. Since a driving pulse is input to the transistor Q1 again after a period T1, the capacitor C needs to be supplied with a charge from a high voltage source $HV_{in}$ in the meantime. It is assumed that electric capacitance of the capacitor C is denoted by $C_1$, the supply time $\tau$ is determined by $R1 \times C_1 = \tau$. The value of R1 is thus determined to satisfy $\tau < T1$.

The driving current of the LD in the switching circuit 1 is determined by a forward current $I_{LD}^{(1)}$ of the LD. A light emission time $t_p$ of the LD is given by $t_p = C_1 \times HV_{in}/I_{LD}^{(1)}$ (see FIG. 9).

The resistor R2 is a current value setting element of the switching circuit 2. If a driving pulse is input to the transistor Q2 and the pulse width of the driving pulse is short, the LD emits light with only the charge supply from the capacitor C. If the pulse width is long, a charge continues to be supplied from the high voltage source $HV_{in}$ even after the charge supply from the capacitor C ends. As a result, the LD continues emitting light.

Figure 10:
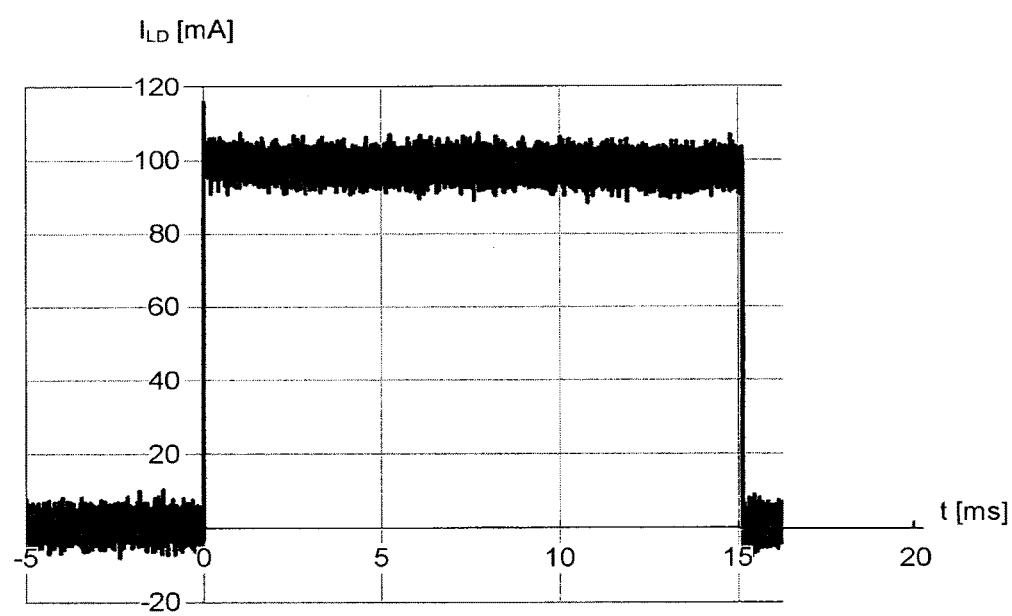
FIG. 10 is a chart illustrating a current level of a driving current generated by the other of the two switching circuits.

A driving current $I_{LD}^{(2)}$ of the LD in the switching circuit 2 is thus given by $I_{LD}^{(2)}|_{short}=(HV_{in}-V_{LD})/R2$ if the pulse width is short, and $I_{LD}^{(2)}|_{long}=(HV_{in}-V_{LD})/(R1+R2)$ if the pulse width is long (see FIG. 10). $V_{LD}$ represents a forward voltage of the LD.

The peak amount of light when the LD emits light with $I_{LD}^{(1)}$ will be denoted by P1. The peak amount of light when the LD emits light with $I_{LD}^{(2)}$ will be denoted by P2. Assuming that $P1 > 1000 \times P2$ is satisfied, then typically $R1 \ll R2$. $I_{LD}^{(2)}|_{short}$ and $I_{LD}^{(2)}|_{long}$ thus have approximately the same values (which may be both represented by a single value $I_{LD}^{(2)}$). In other words, $I_{LD}^{(2)}$ is substantially constant regardless of the pulse width of the driving pulse input to the transistor Q2. As a result, the pulse width of the driving pulse input to the transistor Q2 can be freely changed while $I_{LD}^{(2)}$ is maintained at a desired value.

If the LD is driven by the LD driving circuit 100 configured as described above, the light beam emitted from the LD is converted into a generally parallel light beam through the coupling lens L1, and incident on the polygon mirror M1 having four mirror surfaces. The polygon mirror M1 rotates in a constant direction about a center point at equal distances from the mirror surfaces. If a rotation angle $\theta$ of the polygon mirror M1 is a predetermined angle $\theta_{syn}$, the light beam incident on the polygon mirror M1 is reflected toward the imaging forming lens L2. The light beam is received by the synchronization detection PD, and the output signal of the synchronization detection PD is transmitted to the control unit 101. If the rotation angle $\theta$ of the polygon mirror M1 is in the range of $\theta_S \leq \theta \leq \theta_E$, the light beam incident on the polygon mirror M1 is reflected toward the detection range, whereby the detection range is optically scanned. Reflection light from an object lying in the detection range is reflected by the polygon mirror M1, and guided to the time measurement PD via the reflection mirror M2 and the imaging forming lens L3. Here, the output signal of the time measurement PD is transmitted to the object information acquisition unit 203.

Now, specific functions of the control unit 101 will be described.

If the laser radar 20 is supplied with power and the polygon mirror M1 starts to rotate, a driving pulse is input from the pulse generation circuit 2 to the transistor Q2 after a delay from the start time. As a result, the LD emits light with an output of P2. If the rotation angle of the polygon mirror M1 becomes the predetermined angle $\theta_{syn}$, the light beam having the output P2 reaches the synchronization detection PD through a path of LD→L1→M1→L2→the synchronization detection PD. If the output signal of the synchronization detection PD is transmitted to the control unit 101, the control unit 101 turns the pulse generation circuit 2 off and turns the pulse generation circuit 1 on. If the rotation angle of the polygon mirror M1 is in the predetermined angle range of $\theta_S \leq \theta \leq \theta_E$, a plurality of pulses of light having a light emission time $t_p$ are output at periods T1. The peak amount of light here is P1.

The output P2 needs to satisfy $P2 \times \eta > P_{min}^{(PD)}$, where $P_{min}^{(PD)}$ is the minimum amount of light received by the synchronization detection PD, and $\eta$ is a total light amount loss of the coupling lens L1, the polygon mirror M1, the imaging forming lens L2, and the like. An upper limit value of P2 is determined from a current value at which the LD will not be damaged.

The LD driving circuit 100 according to the present embodiment described above is a semiconductor laser driving apparatus for driving a semiconductor laser (LD) serving as a light source for optical scanning. The LD driving circuit 100 includes the transistors Q1 and Q2, the pulse generation circuit 1, and the pulse generation circuit 2. The transistors Q1 and Q2 each can switch the energization of the LD ON/OFF. The pulse generation circuit 1 periodically outputs first driving pulses to the transistor Q1 in a first time slot. The pulse generation circuit 2 outputs a second driving pulse to the transistor Q2 in a second time slot different from the first time slot.

In such a case, the light emitted from the semiconductor laser in the second time slot can be detected to accurately detect the scanning position in the first time slot without using a rotary encoder (while suppressing an increase in parts count).

As a result, the scanning position can be accurately detected while suppressing an increase in cost.

Since the LD driving circuit 100 does not use a rotary encoder, an increase in the size of the monitoring apparatus 10 in the direction of the rotating shaft of the polygon mirror can be suppressed. An increase in parts count can also be suppressed, which allows suppression of cost increase and improvement of reliability.

The laser radar apparatus disclosed in Japanese Laid-open Patent Publication No. 2011-085577 uses a rotary encoder to detect the scanning position. A rotary encoder typically includes a code wheel in which a slit pattern is formed and a sensor for reading the slit pattern. In the case of using the rotary encoder, the code wheel needs to be attached to the rotating shaft of the polygon mirror. The sensor for reading the code wheel also needs to be arranged in position. This not only increases the parts count to cause an increase in cost and a decrease in reliability, but also increases the size of the apparatus in the direction of the rotating shaft.

The first and second time slots are alternately repeated, starting with the second time slot. The light emitted from the semiconductor laser in each second time slot can thus be detected to accurately detect the scanning position in the first time slot immediately after the second time slot.

The first driving pulses have a fixed pulse width. The second driving pulses have a variable pulse width. In the first time slots, respective scanning positions can thus be uniformly irradiated. The second time slots (scanning positions or scanning times of the light from the semiconductor laser with respect to the photodetector) can be adjusted to make the light incident on the photodetector without fail.

$P1 > 1000 \times P2$ is satisfied, where P1 is the peak amount of light when a first driving pulse is output to the transistor Q1 and the LD emits light, and P2 is the peak amount of light when a second driving pulse is output to the transistor Q2 and the LD emits light.

In such a case, both an increased detection distance by the higher output in the first time slots and improved life of the light source by the lower output in the second time slots can be achieved in a compatible manner. The scanning time of the light with respect to the photodetector can be freely changed while the amount of light incident on the photodetector is maintained at a desired value. As a result, a desired amount of light can be made incident on the photodetector without fail. The peak amounts of light may be such that $P1 \leq 1000 \times P2$. Even in such a case, P2 is desirably smaller than P1 as much as possible.

The LD driving circuit 100 further includes the resistor R2 serving as a current value setting element connected between the LD and the transistor Q2. The lower output in the second time slots can thus be achieved at low cost. The resistor R2 has only to be arranged on the path of the driving current of the LD provided by the second switching element. Instead of the resistor R2, a variable resistor may be used as the current value setting element.

The transistor Q1 is a MOSFET, which can accommodate the higher output in the first time slots and achieve power saving as well.

The laser light emitted from the LD when the second driving pulse is output is received by the synchronization detection PD. The LD driving circuit 100 further includes the control unit 101 which determines the output timing of the first driving pulses on the basis of the output signal of the synchronization detection PD.

The light emission system 201 serving as an optical scanning apparatus includes the LD, the LD driving circuit 100 which drives the LD, and the polygon mirror M1 which deflects the light from the LD driving circuit 100. The synchronization detection PD is arranged on an optical path of the light deflected by the polygon mirror M1.

In such a case, the laser light from the LD can be used to perform both scanning with respect to the synchronization detection PD and scanning with respect to the detection range.

The laser radar 20 serving as an object detection apparatus includes the light emission system 201 serving as the optical scanning apparatus, and the light detection system 202 for detecting the light that is emitted from the light emission system 201 and reflected by an object.

In such a case, the presence or absence of an object, the distance to the object, and the like can be accurately determined while suppressing an increase in cost.

The automobile 1 serving as a mobile apparatus includes the laser radar 20 serving as the object detection apparatus and the vehicle main body (moving body) on which the laser radar 20 is mounted. Control (speed control etc.) of the vehicle main body can thus be accurately performed while suppressing an increase in cost.

Since the monitoring apparatus 10 includes the laser radar 20, the monitoring apparatus 10 can accurately determine object information and movement information.

Figure 11:
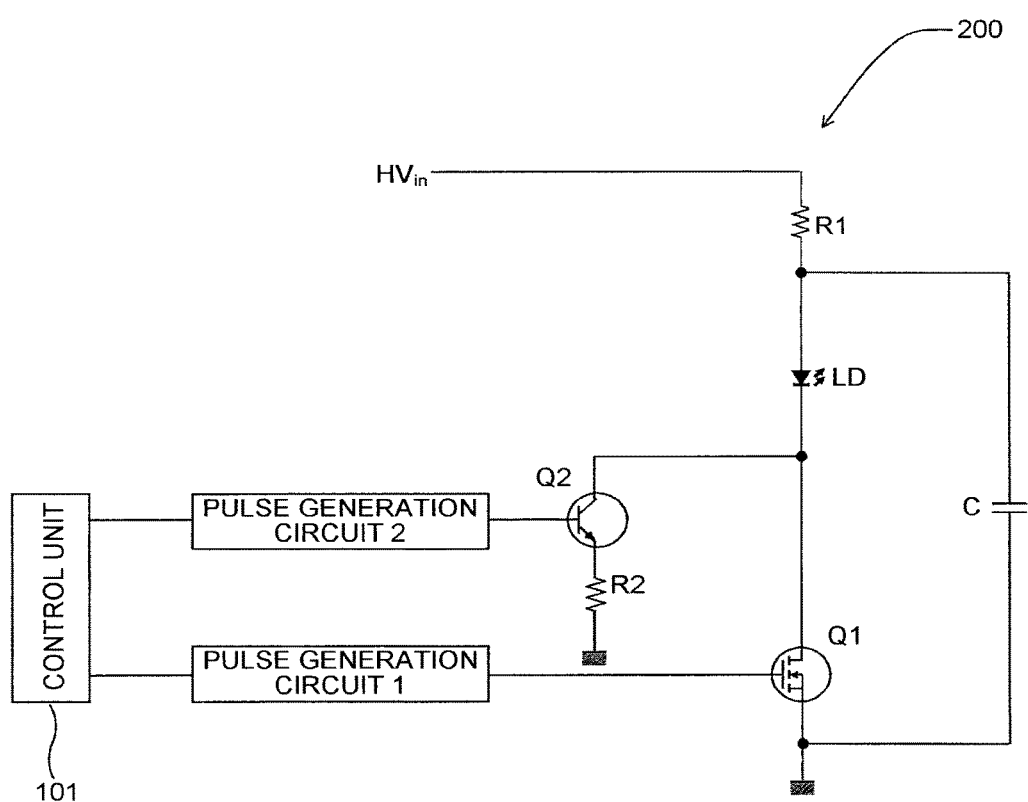
FIG. 11 is a diagram for describing an LD driving circuit according to modification 1.

The configuration of the LD driving circuit described in the foregoing embodiment may be modified as appropriate. For example, FIG. 11 illustrates an LD driving circuit 200 according to modification 1. In the LD driving circuit 200, a switching circuit 1 including a capacitor C and a transistor Q1 and a switching circuit 2' including resistors R1 and R2 and a transistor Q2 are connected to an LD. The transistor Q1 functions as a switch of the switching circuit 1. A driving pulse from the pulse generation circuit 1 is input to the gate electrode of the transistor Q1. The transistor Q2 functions as a switch of the switching circuit 2. A driving pulse from the pulse generation circuit 2 is input to the gate electrode of the transistor Q2. Here, the resistor R2 serving as a current value setting element is connected between the transistor Q2 and the ground.

A MOSFET is used as the transistor Q1. A bipolar transistor capable of generating a stable low current is used as the transistor Q2.

In modification 1, a driving current $I_{LD}^{(2)}$ supplied from the switching circuit 2' to the LD is $I_{LD}^{(2)} = (V_B^{(2)} - V_{BE}^{(2)})/R2$. $V_B^{(2)}$ is a peak voltage of the pulse input from the pulse generation circuit 2. $V_{EE}^{(2)}$ is a forward drop voltage of the transistor Q2.

Figure 12:
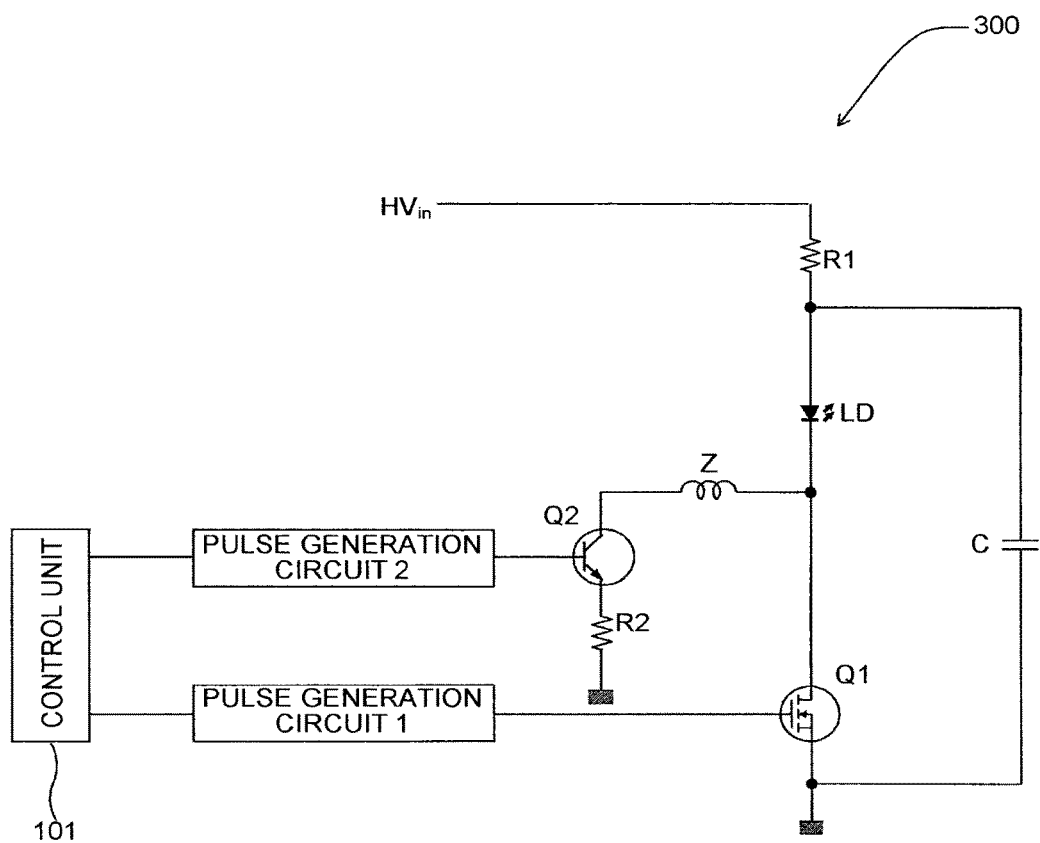
FIG. 12 is a diagram for describing an LD driving circuit according to modification 2.

For example, FIG. 12 illustrates an LD driving circuit 300 according to modification 2, which is obtained by connecting a coil Z (inductor) between the LD and the transistor Q2 of the LD driving circuit 200 according to the foregoing modification 1. The coil Z plays a role in reducing noise that occurs from the switching circuit 2 when the switching circuit 1 is activated. As a result, the LD can perform stable pulse emission. The resistor R2 serving as a current value setting element is connected between the transistor Q2 and the ground.

A MOSFET is used as the transistor Q1. A bipolar transistor capable of generating a stable low current is used as the transistor Q2.

In the foregoing embodiment and modifications, part of the processing of the object information acquisition unit 203 may be performed by the main control unit 40. Part of the processing of the main control unit 40 may be performed by the object information acquisition unit 203.

In the foregoing embodiment and modifications, the monitoring apparatus 10 is described to include one laser radar 20. However, this is not restrictive. A plurality of laser radars 20 may be included according to the size of the vehicle, a monitoring area, and the like.

In the foregoing embodiment and modifications, the laser radar 20 is described to be used in the monitoring apparatus 10 that performs monitoring in the traveling direction of the vehicle. However, this is not restrictive. For example, the laser radar 20 may be used in an apparatus that performs monitoring behind or beside a vehicle.

The laser radar 20 may further be used in a sensing apparatus other than a car-mounted one. In such a case, the main control unit 40 outputs alarm information according to the purpose of the sensing.

The laser radar 20 may be used for applications for detecting only the presence or absence of an object.

The laser radar 20 may be used for applications other than a sensing apparatus (for example, distance measuring apparatuses and shape measuring apparatuses).

The configuration of the laser radar according to the foregoing embodiment and modifications may be modified as appropriate.

For example, in the foregoing embodiment and modifications, a single LD is used as the light source. However, this is not restrictive. For example, an LD array in which a plurality of LDs are arranged in one or two dimensions, a vertical-cavity surface-emitting laser (VCSEL), a VCSEL array in which a plurality of VCSELs are arranged in one or two dimensions, a laser other than a semiconductor laser, a light source other than a laser, and the like may be used. Examples of an LD array in which a plurality of LDs are arranged in one dimension may include a stack type LD array in which a plurality of LDs are stacked and an LD array in which a plurality of LDs are arranged in a row.

For example, in the foregoing embodiment and modifications, the light emission system 201 is described to be arranged on the +Z side of the light detection system 202. However, this is not restrictive.

For example, in the foregoing embodiment and modifications, the coupling lens L1 may be replaced with a coupling optical system that has a function equivalent to that of the coupling lens L1 and includes a plurality of optical elements.

For example, in the foregoing embodiment and modifications, the four-surface polygon mirror M1 having four mirror surfaces (deflection reflecting surfaces) is used. However, a polygon mirror having five or more surfaces may be used.

For example, the polygon mirror (rotating polygonal mirror) may be replaced with other mirrors such as one- to three-surface rotating mirrors, a galvanometer mirror, and a MEMS mirror.

The foregoing embodiment and modifications may include a rotating mechanism for rotating the laser radar 20 about the Z-axis.

The optical detection system does not need to include an imaging forming lens, and may include other optical elements (such as a light collecting mirror).

The LD driving circuits according to the foregoing embodiment and modifications may be modified as appropriate.

For example, in the foregoing embodiment, MOSFETs are used as the transistors Q1 and Q2. However, other transistors such as a junction type FET and a bipolar transistor may be used as at least either one of the transistors Q1 and Q2.

For example, in the foregoing modifications, a MOSFET is used as the transistor Q1. However, this is not restrictive. Other transistors such as a junction type FET and a bipolar transistor may be used.

For example, in the foregoing modifications, a bipolar transistor is used as the transistor Q2. However, this is not restrictive. Other transistors such as a MOSFET and a junction type FET may be used.

The foregoing embodiment and modifications have been described by using an automobile as an example of the moving body on which the object detection apparatus is mounted. However, the moving body may be vehicles other than an automobile, as well as aircraft, ships, and the like.

As is clear from the foregoing description, the optical scanning apparatus and the object detection apparatus according to the foregoing embodiment and modifications are techniques using a so-called time of flight (TOF) method for measuring a distance to an object. Such techniques are widely used in industrial fields such as motion capture techniques and range finders, aside from the sensing of a moving body. In other words, the object detection apparatus according to the present invention does not necessarily need to be mounted on a moving body.

The optical scanning apparatus according to the foregoing embodiment and modifications is used in an object detection apparatus. However, this is not restrictive. For example, the optical scanning apparatus may be used in an image forming apparatus (such as a printer and a copying machine) that forms an image by scanning a photoconductor with light, or an image display apparatus (such as a projector, a head-up display, and a head mounted display) that displays an image by scanning a screen with light.

A thinking process through which the inventor has contrived the foregoing embodiment and modifications will be described below.

A laser radar has been known in recent years as a car-mounted apparatus for detecting the presence or absence of an object in front of a running vehicle and a distance to the object. Various optical systems intended for a laser radar have been known. As disclosed in Japanese Unexamined Patent Application Publication No. 2011-128112, Japanese Laid-open Patent Publication No. 2011-128112, Japanese Laid-open Patent Publication No. 2009-063339, Japanese Laid-open Patent Publication No. 2012-107984 and Japanese Laid-open Patent Publication No. 2009-069003, the presence or absence of an object in a desired range and a distance to the object can be detected by scanning laser light emitted from a light source with a rotating mirror and detecting light reflected or scattered by the object with a photodetector via the rotating mirror again.

Such a scanning type laser radar scans the laser light over both an effective scanning area (detection range) and a detectable area capable of detection by the photodetector. The laser light can thus be concentrated on only a part where detection is needed, which is advantageous in terms of detection accuracy and detection distance. The area capable of detection by the photodetector can also be minimized, which is advantageous in terms of the cost of the photodetector.

Among the methods for detecting an object by performing optical scanning over a desired angle range (effective scanning area) is one using a rotary encoder as described in Japanese Laid-open Patent Publication No. 2011-085577. A rotary encoder can detect an angular position in the direction of rotation. On the basis of a signal from the rotary encoder, control can be performed to accurately determine the angular position of the effective scanning area.

A rotary encoder typically includes a code wheel in which a slit pattern is formed and a sensor for reading the slit pattern. According to the method using a rotary encoder, the code wheel needs to be attached to the rotating shaft of the rotating mirror. The sensor for reading the code wheel also needs to be arranged in position. This not only causes an increase in cost, but also increases the size of the apparatus in the direction of the rotating shaft.

To address such a problem, the inventor has contrived the foregoing embodiment and modifications.

According to the embodiments of the present invention, the scanning position can be accurately detected while suppressing an increase in cost.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor laser driving apparatus for driving a semiconductor laser serving as a light source for optical scanning, the semiconductor laser driving apparatus comprising:
   first and second switching elements that are each capable of switching energization of the semiconductor laser ON/OFF;
   a first pulse generation circuit that intermittently outputs first driving pulses to the first switching element in a first time slot; and
   a second pulse generation circuit that outputs a second driving pulse to the second switching element in a second time slot different from the first time slot,
   wherein a current value setting element is arranged on a path of a driving current of the semiconductor laser provided by the second switching element.

2. The semiconductor laser driving apparatus according to claim 1, wherein the first and second time slots are alternately repeated, starting with the second time slot.

3. The semiconductor laser driving apparatus according to claim 1, wherein each of the first driving pulses output by the first pulse generation circuit has a fixed pulse width, and the second driving pulse output by the second pulse generation circuit has a variable pulse width.

4. The semiconductor laser driving apparatus according to claim 1, wherein
   $P1>1000\times P2$ is satisfied, where P1 is a peak amount of light when the first driving pulses are output to the first switching element and the semiconductor laser emits light, and P2 is a peak amount of light when the second driving pulse is output to the second switching element and the semiconductor laser emits light.

5. The semiconductor laser driving apparatus according to claim 1, wherein the current value setting element is a resistor.

6. The semiconductor laser driving apparatus according to claim 1, wherein the first switching element is a MOSFET.

7. The semiconductor laser driving apparatus according to claim 1, wherein the second switching element is a bipolar transistor.

8. A semiconductor laser driving apparatus for driving a semiconductor laser serving as a light source for optical scanning, the semiconductor laser driving apparatus comprising:
   first and second switching elements that are each capable of switching energization of the semiconductor laser ON/OFF;
   a first pulse generation circuit that intermittently outputs first driving pulses to the first switching element in a first time slot;
   a second pulse generation circuit that outputs a second driving pulse to the second switching element in a second time slot different from the first time slot; and
   an inductor that is connected between the semiconductor laser and the second switching element.

9. The semiconductor laser driving apparatus of claim 8, wherein $P1>1000\times P2$ is satisfied, where P1 is a peak amount of light when the first driving pulses are output to the first switching element and the semiconductor laser emits light, and P2 is a peak amount of light when the second driving pulse is output to the second switching element and the semiconductor laser emits light.

10. The semiconductor laser driving apparatus of claim 8, wherein the first and second time slots are alternately repeated, starting with the second time slot.

11. The semiconductor laser driving apparatus of claim 8, wherein each of the first driving pulses output by the first pulse generation circuit has a fixed pulse width, and the second driving pulse output by the second pulse generation circuit has a variable pulse width.

12. The semiconductor laser driving apparatus of claim 8, wherein the first switching element is a MOSFET and the second switching element is a bipolar transistor.

13. A semiconductor laser driving apparatus for driving a semiconductor laser serving as a light source for optical scanning, the semiconductor laser driving apparatus comprising:
   first and second switching elements that are each capable of switching energization of the semiconductor laser ON/OFF;
   a first pulse generation circuit that intermittently outputs first driving pulses to the first switching element in a first time slot; and
   a second pulse generation circuit that outputs a second driving pulse to the second switching element in a second time slot different from the first time slot, wherein
   laser light emitted from the semiconductor laser when the second driving pulse is output is received by a photodetector, and
   the semiconductor laser driving apparatus further comprises a controller that determines output timing of the first driving pulses based on an output signal of the photodetector.

14. An optical scanning apparatus comprising:
   a semiconductor laser;
   the semiconductor laser driving apparatus according to claim 13, the semiconductor laser driving apparatus driving the semiconductor laser; and
   a deflector that deflects light from the semiconductor laser,
   wherein the photodetector is arranged on an optical path of the light deflected by the deflector.

15. An object detection apparatus comprising:
   the optical scanning apparatus according to claim 14; and
   a light detection system that detects light that is emitted from the optical scanning apparatus and reflected by an object.

16. A mobile apparatus comprising:
   the object detection apparatus according to claim 15; and
   a moving body on which the object detection apparatus is mounted.

17. The semiconductor laser driving apparatus of claim 13, wherein $P1>1000\times P2$ is satisfied, where P1 is a peak amount of light when the first driving pulses are output to the first switching element and the semiconductor laser emits light, and P2 is a peak amount of light when the second driving pulse is output to the second switching element and the semiconductor laser emits light.

18. The semiconductor laser driving apparatus of claim 13, wherein the first and second time slots are alternately repeated, starting with the second time slot.

19. The semiconductor laser driving apparatus of claim 13, wherein each of the first driving pulses output by the first pulse generation circuit has a fixed pulse width, and the second driving pulse output by the second pulse generation circuit has a variable pulse width.

20. The semiconductor laser driving apparatus of claim 13, wherein the first switching element is a MOSFET and the second switching element is a bipolar transistor.

* * * * *